United States Patent

Yoshida et al.

[15] 3,634,929

[45] Jan. 18, 1972

[54] METHOD OF MANUFACTURING SEMICONDUCTOR INTEGRATED CIRCUITS

[72] Inventors: Kenji Yoshida, Yokohama-shi; Osamu Ichikawa, Kawasaki-shi, both of Japan

[73] Assignee: Tokyo Shibaura Electric Co., Ltd., Kawasaki-shi, Japan

[22] Filed: Oct. 29, 1969

[21] Appl. No.: 872,223

[30] Foreign Application Priority Data

Nov. 2, 1968 Japan....................................43/79754

[52] U.S. Cl.......................................29/577, 29/584, 29/628

[51] Int. Cl...........................................B01j 17/00, H01l 1/16

[58] Field of Search ............................29/628, 625, 577, 584

[56] References Cited

UNITED STATES PATENTS 3,312,871 3/1967 Seki et al...............................317/101

3,390,012 6/1968 Haberecht..............................117/212

2,872,565 2/1959 Brooks..................................174/84 X 3,485,934 12/1969 Prather...................................29/625

*Primary Examiner*—John F. Campbell

*Assistant Examiner*—W. Tupman

*Attorney*—Flynn & Frishauf

[57] ABSTRACT

A semiconductor integrated circuit is manufactured by forming a plurality of circuit elements in a semiconductor substrate, covering the circuit elements with an insulating film except exposed portions thereof, forming a first conductive path on the insulating film, at least a portion of the first conductive path overlaying predetermined portions of the circuit elements and electrically connected therewith, applying a second insulating film on the first conductive path, forming a second conductive path to overlay the first conductive path and applying a breakdown voltage across the first and second conductive paths to breakdown the second insulating film interposed therebetween via a circuit element, thus electrically interconnecting the first and second conductive paths.

6 Claims, 12 Drawing Figures

METHOD OF MANUFACTURING SEMICONDUCTOR INTEGRATED CIRCUITS

Recent semiconductor devices, especially semiconductor integrated circuits are becoming more and more complicated. For example, in LSI (large scale integration) it is difficult to provide required wirings with only one layer, thus requiring multilayered wirings. Such complicated integrated circuits are manufactured in relatively small quantities but in a variety of special types. For this reason, in order to improve production efficiency and to reduce the cost and period of manufacture, it is highly desirable to provide a method of manufacturing a variety of semiconductor integrated circuits from a plurality of identical integrated circuits, each having the same circuit elements formed in a semiconductor substrate and a plurality of electroconductive layers formed on the surface of the substrate, by changing the connection between electroconductive layers.

Among special applications of semiconductor integrated circuits are included integrated diode array fixed memories. Such memories are desirable to be so constructed that purchasers thereof can change their internal connections from the outside as desired.

As shown in FIG. 1, one type of a prior art integrated diode array fixed memory comprises a plurality of diodes 1*a*, 1*b*, 1*c*, 1*d* ... connected between respective row signal lines 3*a*, 3*b* ... and column signal lines 4*a*, 4*b* ... which are arranged in a matrix and fusible elements 2*a*, 2*b*, 2*c*, 2*d* ... connected in series with respective diodes. The fusible elements may be formed by decreasing the width of anode leads. Thus, excessive current is passed through unnecessary diodes to fuse fusible elements associated therewith and isolate such diodes whereby a desired memory pattern is formed.

However, according to such a method of changing the internal connection of integrated diode array fixed memories, in order to blow the fusible elements it is necessary to pass considerably large current. Further, the difference in the characteristics of diodes affects the blowing characteristics of the fusible elements making it difficult to assure positive connections. In addition, molten metal is sputtered by blown fusible elements to contaminate and deteriorate nearby circuit elements.

It is therefore an object of this invention to provide a method of establishing electrical connections between selective conductive paths in a semiconductor integrated circuit without the accompanying above-described difficulties.

SUMMARY OF THE INVENTION

According to this invention there is provided a method of manufacturing a semiconductor integrated circuit comprising the steps of forming a plurality of spaced-apart circuit elements in a semiconductor substrate, each one of said circuit elements having at least one region with a portion thereof exposed on the surface of the substrate, applying a first insulating film on the surface of the substrate except for said exposed portions of said regions, forming a first conductive path to overlay the first insulating film, at least a portion of the first conductive path overlaying portions of said regions and electrically connected therewith, forming a second insulating film on said first conductive path, forming a second conductive path on the second insulating film overlaying the first conductive path, and applying a breakdown voltage across first and second conductive paths which are separated by said second insulating film, said breakdown voltage being applied to said second insulating film via at least one of said circuit elements and having a magnitude sufficient to breakdown the second insulating film to electrically interconnect first and second conductive paths.

This invention can be more fully understood from the following detailed description when taken in connection with the accompanying drawings, in which.

Figure 3A:
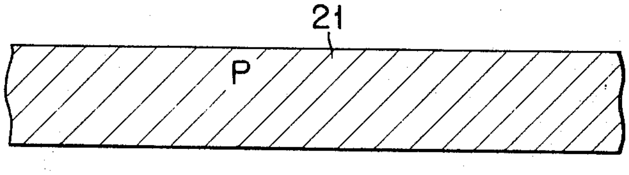
FIGS. 3A to 3G are sectional views illustrating steps of manufacturing the integrated diode array fixed memory represented by the equivalent circuit shown in FIG. 2.
Figure 3B:
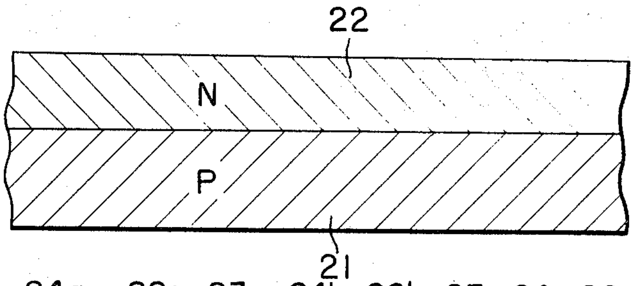
Figures 3C, 3D, 3E:
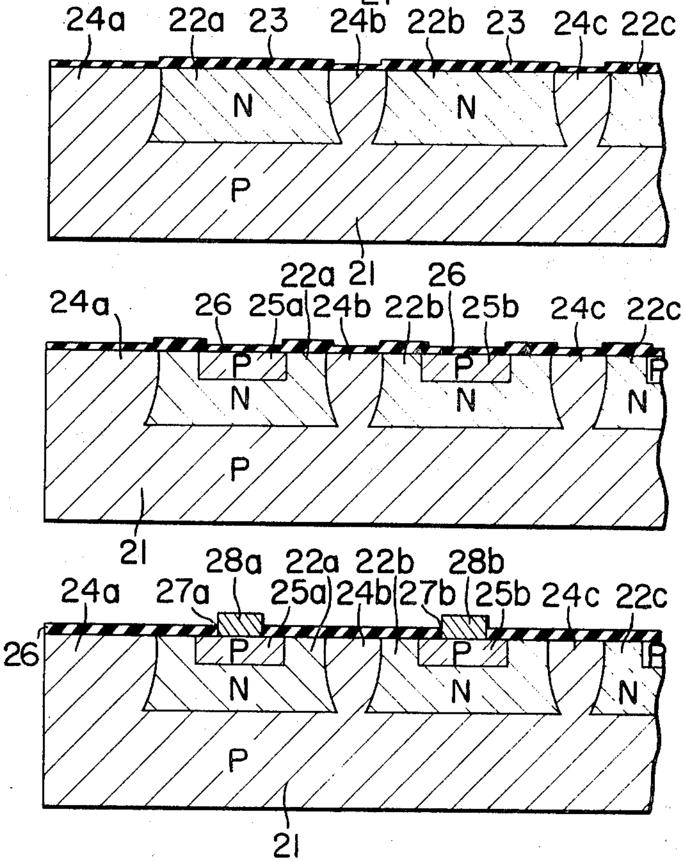
Figure 3F:
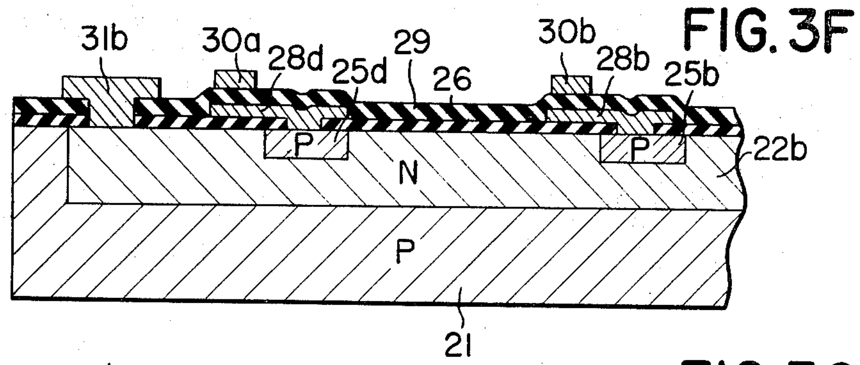
Figure 3G:
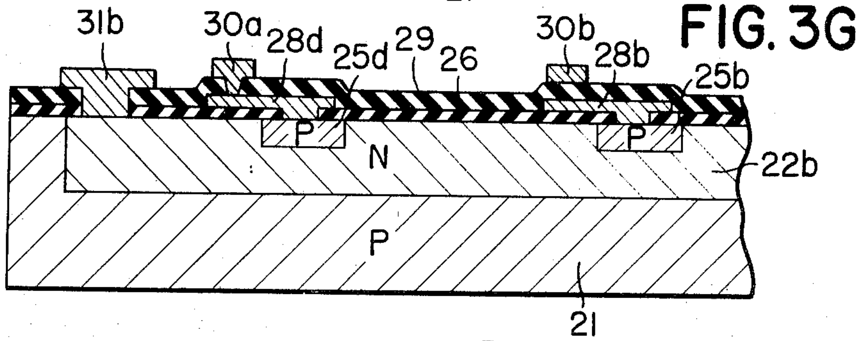
Figure 3H:
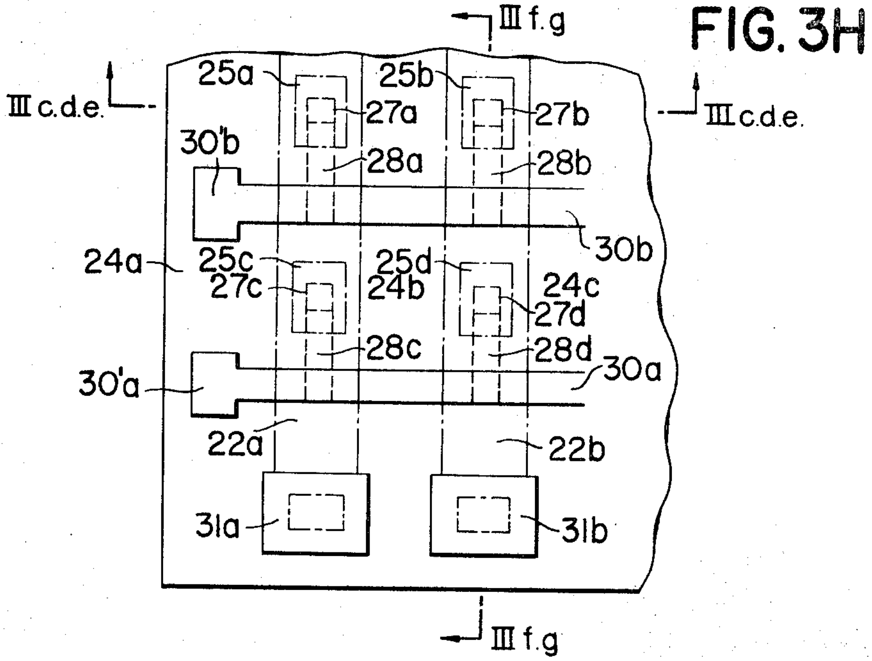
Figure 4A:
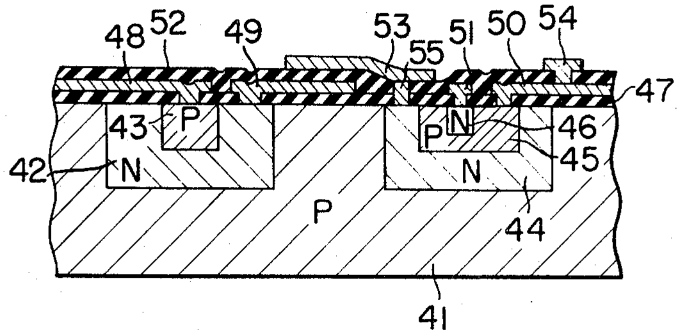
Figure 4B:
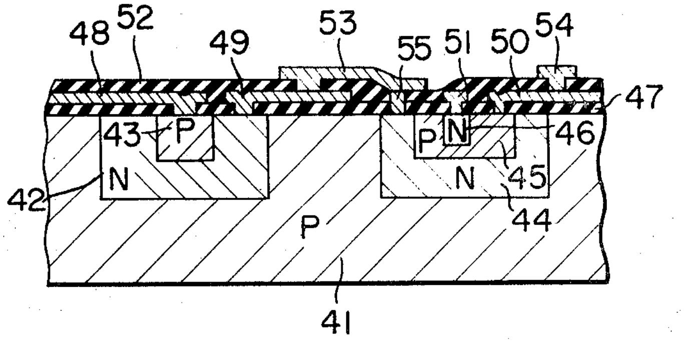

FIG. 3H is a plan view showing the positional relationship between various circuit elements of the integrated diode array fixed memory, FIGS. 3C, 3D and 3E being sections taken along a line III*c.d.e.*—III*c.d.e.* and FIGS. 3F and 3G being sections taken along a line III*f.g.*—III*f.g.* in FIG. 3H; and FIGS. 4A and 4B show sections of LSI having multilayered wirings constructed according to this invention.

Figure 1:
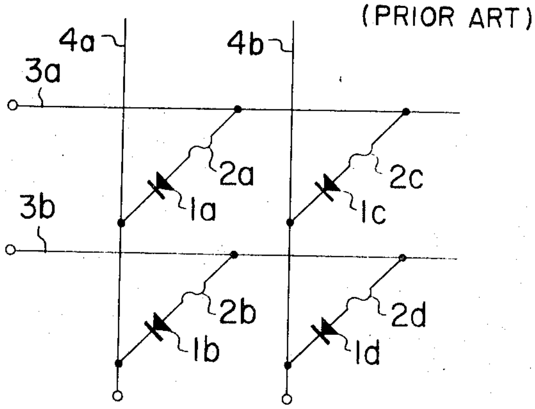
FIG. 1 (PRIOR ART)
FIG. 1 shows an equivalent circuit of a prior art integrated diode array fixed memory.
Figure 2:
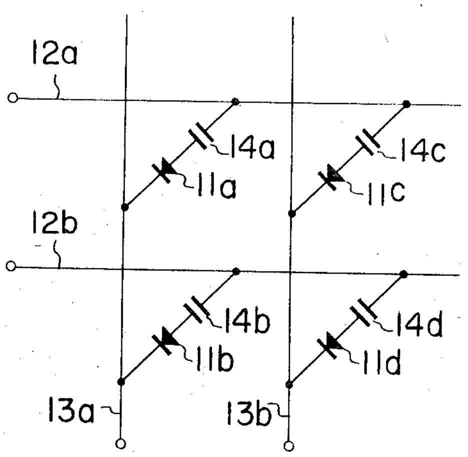
FIG. 2 shows an equivalent circuit of this invention as applied to an integrated diode array fixed memory.

Referring now to FIG. 2 which shows an equivalent circuit of one embodiment of an integrated diode array fixed memory embodying this invention, a plurality of diodes 11*a*, 11*b*, 11*c*, 11*d* ... are connected between respective row signal lines 12*a*, 12*b* ... and column signal lines 13*a*, 13*b* ... of a matrix through minute gaps 14*a*, 14*b*, 14*c*, 14*d* ... formed by thin insulating layers. These gaps are short circuited by selective breakdown of insulating layers by applying a voltage sufficient to cause such breakdown across selected signal lines so as to form a desired memory pattern.

The method of manufacturing such an integrated diode fixed array memory device will now be described with reference of FIGS. 3A to 3H inclusive.

As shown in FIG. 3B an N-type epitaxially grown layer 22 having a specific resistance of about 0.1 ohm-cm. is formed on a P-type wafer or substrate 21 shown in FIG. 3A and having a specific resistance of the order of about 10 ohm-cm. Then a plurality of spaced-apart parallel strips of oxide film ($SiO_2$) 23 are formed on the N-type epitaxial layer 22 and a P-type impurity is diffused into the N-type epitaxial layer 22 through exposed areas between strips of oxide film, thus forming a plurality of stripe-shaped N-type regions 22*a*, 22*b*, 22*c* ... separated by P-type regions 24*a*, 24*b*, 24*c* ..., as shown in FIG. 3C. Oxide films overlaying stripes of N-type regions 22*a*, 22*b*, 22*c* ... are removed at portions arranged as islands to expose underlaying N-type regions and a P-type impurity is diffused into N-type regions through exposed islands to form islands of P-type regions 25*a*, 25*b* ... in the N-type regions, as shown in FIG. 3D. During diffusion of the P-type impurity, oxide films 26 are formed on the P-type regions and then openings 27*a*, 27*b* ... for attaching electrodes are formed through the oxide films 26 to expose the P-type regions and over oxide films 26 are formed first conductive paths or electrode terminals 28*a*, 28*b* ... by vapor depositive aluminum in the form of stripes, said terminals extending a short distance from P-type regions 25*a*, 25*b* ... as shown in FIGS. 3E and 3F. Then an insulating film 29 of $Al_2O_3$ having a thickness of approximately 5,000 A. is provided by high-frequency sputtering technique over the entire surface of oxide film 26 and electrode terminals 28*a*, 28*b* ..., as shown in FIG. 3F or at least to overlay these electrode terminals. Then a thin metal film of aluminum is applied on the surface of the oxide film 29 and the metal film is etched to leave stripes of second conductive paths 30*a*, 30*b* ... on the oxide film 29 above respective electrode terminals 28*a*, 28*b* ..., said stripes extending at right angles with respect to stripes of N-type regions 22*a*, 22*b* ... and separating from P-type regions 25*a*, 25*b* ... as shown in FIG. 3H. The purpose of providing stripes of second conductive paths 30*a*, 30*b* ... separating from P-type regions 25*a*, 25*b* ... is to prevent circuit elements from being damaged by heat generated when the insulating film is caused to breakdown as will be described later. Then openings are formed through insulating films 26 and 29 as by etching at the ends of stripes of N-type regions 22*a*, 22*b* ..., and electrode terminals 31*a*, 31*b* ... are connected to the exposed N-type regions through these openings as shown in FIGS. 3F, 3G and 3H. Leads (not shown) are then bonded to electrode terminals 31*a*, 31*b* ... and terminals 30'*a*, 30'*b* ... of second conductive paths 30*a*, 30*b* ... to complete an integrated diode array fixed memory, as shown in FIG. 3H, wherein conductive paths 30*a*, 30*b* ... of metal films serve as row signal lines 12*a*, 12*b* ... while stripes of N-type regions 22*a*, 22*b* in the wafer 21 as the column signal lines 13*a*, 13*b* ... in FIG. 2.

To form a desired memory pattern a breakdown voltage is impressed across signal lines connected to diodes to be used in the integrated circuit. Thus, for example, a step function voltage or pulse voltage of about 15 volts is applied across signal lines 22*b* and 30*a* in the forward direction of the diode connected thereacross. This causes a portion of insulating film 29 to break down and to melt a portion of conductive path 30*a* of metal film so that the molten metal flows into the opening formed by the breakdown to reach electrode 28 *d* underlaying the insulating film 29 as shown in FIG. 3G. In this manner, one of the minute gaps shown in FIG. 2 is short circuited. In the foregoing, the voltage was impressed upon the diode in the forward direction, but a backward direction also may be used. Although the voltage to be impressed depends upon such factors as the material of the insulating film 29, the condition of forming the same, the thickness of the film and the method of applying the voltage, in the above-described example, it was noted that a voltage of about 15 volts is suitable. For an insulating film of $Al_2O_3$ having a thickness of about 3,000 A., a voltage of about 10 volts is suitable whereas a voltage of about 20 v. is suitable for an insulating film of about 8,000 A. The insulating films have sufficient insulating strength against typical operating voltages of the order of 5 volts. The capacitance of the not short circuited gaps is only about 0.3 pf., thus not causing any appreciable trouble, when the overlapped area of crossed conductive paths amounts to 1,600 square microns for example. The stray capacitance may be further reduced by utilizing material of small relative dielectric constant as the insulating film, or by increasing the thickness of the film or by decreasing the overlapped areas of crossed conductive paths.

As a method of applying the breakdown voltage the voltage may be increased gradually.

Alternatively a step function voltage may be applied, in which case the insulating film breaks down at the buildup of the voltage. In these cases, the current flows through the circuit element after breakdown. However, this current can be limited by an external resistor to a value not to destroy the circuit element. As a further alternative, a pulse voltage of a definite width may be applied. Again, the insulating film is caused to breakdown at the buildup of the voltage and the adverse effect upon the circuit element can be minimized by controlling the width of the pulse. As the breakdown voltage, it is preferable to use a voltage at which the value thereof is sharply changed at a short period of time, such as, for example, said pulse voltage or said step function voltage.

Instead of utilizing $Al_2O_3$ mentioned hereinabove, silicon oxides such as $SiO_2$ and SiO, $Si_3N_4$, $Y_2O_3$, BeO, $ThO_2$, $CeO_2$, $SnO_2$ and so forth may be used as the insulating film 29. However, in view of the required low dielectric constant for reduced stray capacitance and uniform characteristics of the film for assuring positive breakdown of the desired gap under a definite voltage, $Al_2O_3$, $SiO_2$ and $Si_3N_4$ are preferred. The insulating film may be formed by any conventional methods including high-temperature oxidation, low-temperature oxidation, sputtering and the like.

While gold, copper, nickel or the like conductor can be substituted for aluminum to construct conductive paths, aluminum is most preferred in view of its high adhesive strength to the insulating film, its low melting point and high specific conductivity. The bonding strength of gold and copper to the insulating film is low so that it is necessary to apply a prime coating of chromium when using these materials.

The conductive paths may be formed by any one of many conventional techniques such as vapor deposition, sputtering and electroplating.

When compared with the prior art, with the above-described diode array fixed memory, there is no fear of sputtering the molten metal upon other circuit elements as long as the voltage applied across the gap is not excessively high. Further, as the breakdown of the insulating layer is determined mainly dependent upon the voltage instead of current, the breakdown will not be affected by differences in the characteristics of diodes even when the breakdown voltage is impressed across the gap through the diode. In the case of an integrated diode array fixed memory, the number of diodes employed is generally in the order of from 10 to 20 percent of the total diodes included therein, it is possible to form the desired memory pattern in a shorter time than the prior method of isolating diodes by flowing fusible elements connected in series therewith.

The present invention is also suitable for establishing electrical connections between circuit elements of LSI requiring particularly, Such application will now be described with reference P-type FIGS. 4A and 4B.

In this example, a diode and a transistor are formed in a P-type semiconductor substrate. More particularly , an N-type region 42 is diffused in a P-ype semiconductor substrate 41 and a P-type region 43 is diffused in the N-type region to form a diode. Spaced by a sufficient insulating distance from the N-type region 42 of this diode is diffused an N-type region 44 which acts as the collector region of a transistor into the P-type substrate 41 and a P-type region 45 acting as the base region is diffused in the N-type region 44. Then an N-type region 46 acting as the emitter region is diffused in the P-type region 45 to form the transistor. Diffusion of these regions is performed by utilizing a mask of an oxide film as is well known in the art.

Then openings are formed through the oxide film 47 by etching to expose portions of the P-type region 43 and the N-type region 42 of the diode and the P-type region 45 or the base region and the N-type region 46 or the emitter region and N-type region 44 or the collection region of the transistor. Conductive paths of aluminum 48, 49, 50, 51 and 55 are then formed on these exposed portions and on the oxide film 47. Thereafter an insulator film 52 of $Al_2O_3$, for example, is formed on the remaining portions of the oxide film 47 and the first conductive paths 48, 49, 50, 51 and 55. An opening is then formed through the insulating film 52 overlaying the first conductive path 55 to expose a portion thereof, and a second conductive path 53 is formed on this exposed portion and on the insulating film 52 to overlay the first conductive path 49 as shown in FIG. 4A. One of the first conductive paths or electrode 48 connected to the P-type region of the diode and the second conductive path 53 are connected to external terminals. Where it is desired to interconnect the first conductive path 49 and the second conductive path 53, a breakdown voltage of a magnitude sufficient to breakdown insulating layer 52 is applied across the second conductive path 53 and the first conductive path 48 in the forward direction of the diode. As substantially all of the voltage is applied across the first and second conductive paths 49 and 53 through the diode, the insulating film 52 interposed between them is caused to break down to short circuit the first and second conductive paths 49 and 53 as above described, thus interconnecting the collector region of the transistor and the N-type region of the diode as shown in FIG. 4B.

Where it is desired to connect another second conductive path 54 to one of the first conductive paths, for example, path 50, such interconnection may be provided by applying the breakdown voltage across these conductive paths. Alternatively, an opening may be formed by etching through the insulating film 52 overlaying the first conductive path 50 and then the second conductive path 54 may be formed on the exposed portion of the conductive path 50 and over a portion of the insulating film 52.

While two-layered wiring has been described in connection with the LSI shown in FIGS. 4A and 4B, it will be clear that the invention is not limited to two-layered wiring but may be applied to wirings of three or more layers with equal results.

In the LSI, the type of the insulating film, conditions of forming the same, thickness of the film, the method of applying the breakdown voltage, the material of the conductive paths are identical to those of the integrated diode array fixed memory.

We claim:

1. A method of manufacturing a semiconductor integrated circuit comprising the steps of:

forming a plurality of circuit elements spaced apart in a semiconductor substrate, each one of said circuit elements having at least one region with a portion thereof exposed on the surface of said substrate;

forming a first insulating film on the surface of said substrate except said exposed portions of said regions;

forming first conductive paths to overlay said first insulating film, at least a portion of each one of said first conductive paths being disposed on said exposed portion of said respective region and being electrically connected therewith to provide an ohmic connection therebetween;

forming a second insulating film on said first conductive paths;

forming second conductive paths on said second insulating film overlaying said first conductive paths;

and applying a breakdown voltage across said first and second conductive paths to break down said second insulating film disposed therebetween via at least one of said circuit elements formed in said semiconductor substrate, thereby to electrically interconnect said first and second conductive paths.

2. The method of manufacturing a semiconductor integrated circuit according to claim 1 wherein at least one of said circuit elements is a diode formed by an N-conductivity type region and a P-conductivity type region and wherein said breakdown voltage is applied across said first and second conductive paths via a PN-junction defined by said N-conductivity type and P-conductivity type regions.

3. The method of manufacturing a semiconductor integrated circuit according to claim 1 wherein said circuit elements are diodes comprised by forming a plurality of elongated stripe-shaped regions in said substrate, said regions having opposite conductivity type to said substrate, and forming a plurality of spaced-apart regions in said stripe-shaped regions, said spaced-apart regions having opposite conductivity type to said stripe-shaped regions to form PN-junctions therewith;

said first conductive paths comprising spaced-apart first conductive stripes respectively electrically connected to said spaced-apart regions formed in said stripe-shaped regions, each of said first conductive stripes extending to overlay portions of the surface of said substrate which are covered by said first insulating film and in which said spaced-apart regions are not formed;

said second conductive paths include spaced-apart second conductive stripes extending to overlay portions of the surface of said substrate which are covered by said second insulating film and in which said spaced-apart regions are not formed, each of said second conductive stripes crossing each of said first conductive stripes with said second insulating film interposed therebetween;

and wherein said breakdown voltage is applied across said first and second conductive stripes which are required to be electrically interconnected via said PN-junctions of said diodes, thereby to form a diode array fixed memory with a desired memory pattern.

4. The method according to claim 1 wherein said breakdown voltage is a voltage at which the value thereof is sharply changed at a short period of time.

5. The method according to claim 1 wherein said first and second conductive paths are made of aluminum material.

6. The method according to claim 1 wherein said first and said second insulating films are made of a member selected from the group consisting of $Al_2O_3$, $SiO_2$ and $Si_3N_4$.

* * * * *